United States Patent [19]

Lee

[11] 4,069,459
[45] Jan. 17, 1978

[54] FEEDBACK CAPACITOR DIVIDER

[75] Inventor: J. Spencer Lee, Santa Barbara, Calif.

[73] Assignee: Santa Barbara Research Center, Goleta, Calif.

[21] Appl. No.: 716,929

[22] Filed: Aug. 23, 1976

[51] Int. Cl.[2] .............................................. H03F 1/36
[52] U.S. Cl. .................................... 330/107; 330/103; 330/109; 330/110
[58] Field of Search ............... 330/107, 109, 108, 110, 330/103

[56] References Cited

U.S. PATENT DOCUMENTS

| 3,465,276 | 9/1969 | Silva et al. | 330/108 X |
| 3,906,390 | 9/1975 | Rollett | 330/107 |
| 3,946,328 | 3/1976 | Boctor | 330/109 X |
| 3,972,006 | 7/1976 | Ruegg | 330/107 |

OTHER PUBLICATIONS

Melen – "Tunable Active Filter Maintains Constant Q", — *Electronics,* p. 72, July 1971.

*Primary Examiner*—Lawrence J. Dahl
*Attorney, Agent, or Firm*—Martin E. Gerry; W. H. MacAllister

[57] ABSTRACT

An amplifier circuit, comprising a capacitive-resistive network electrically connected between the input and output of the amplifier wherein the network provides equivalent capacitance between the input and output thereby providing frequency response compensation.

2 Claims, 4 Drawing Figures

U.S. Patent  Jan. 17, 1978  4,069,459
Fig. 1.
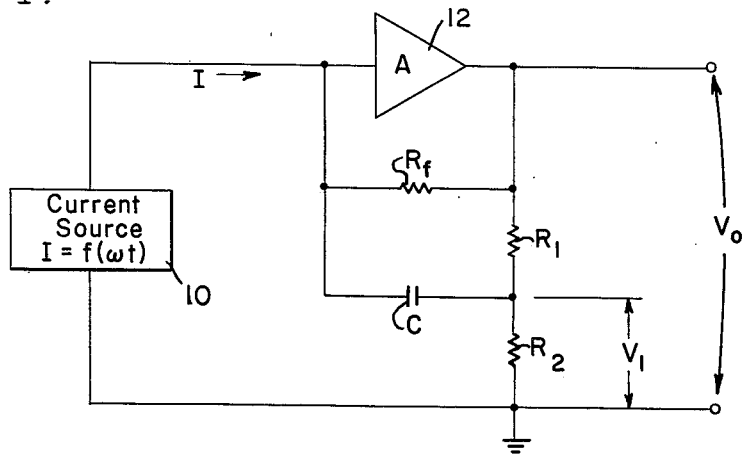
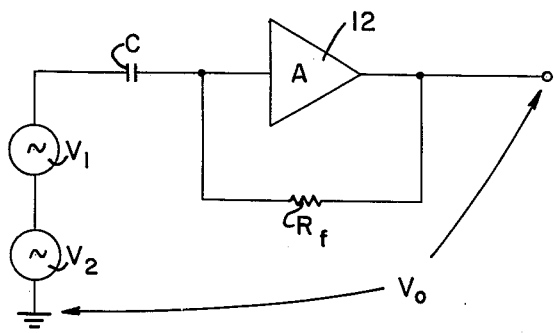
Fig. 2.
Fig. 4.
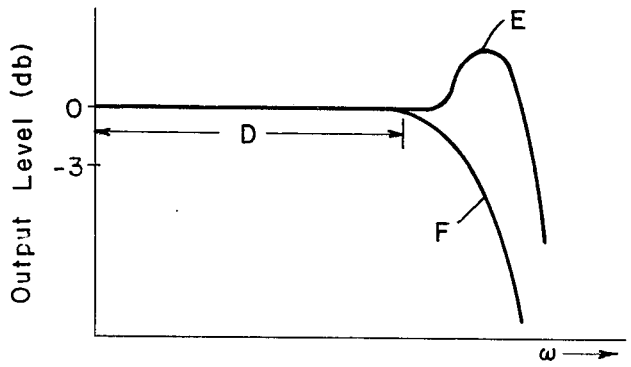
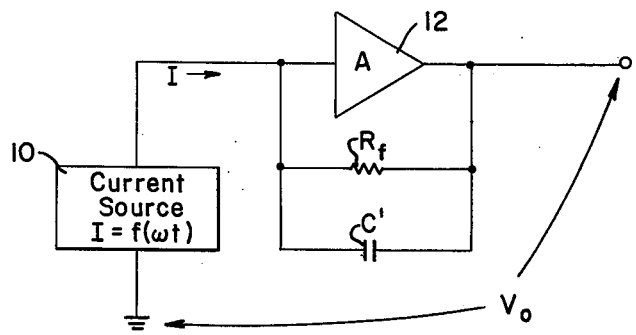
Fig. 3.

FEEDBACK CAPACITOR DIVIDER

BACKGROUND OF THE INVENTION

This invention is in the field of amplifier characteristic compensation, and more particularly providing a method for obtaining sub picofarad effective capacitances for such compensation.

No specific art can be found in this field.

In practice, feedback resistors used between amplifier input and output which are often so large that the amplifier circuit cannot be easily compensated and desired pulse response obtained. This is due largely to the fact that minute picofarad capacitors are required to effect such compensation and no such minute capacitors are in fact available.

SUMMARY OF THE INVENTION

The objective of this invention is to provide a method of enabling amplifier circuit compensation to be accomplished.

Specifically, the invention provides for utilizing a capacitance-resistive network between the amplifier input and output comprising obtainable capacitors and resistors wherein an effective capacitance can be attained which is in the low picofarad range.

BRIEF DESCRIPTION OF THE DRAWINGS

FIG. 1 is a schematic showing a compensated amplifier in accordance with this invention fed by a conventional current signal source.

FIG. 2 is a schematic of Thevenin equivalent of FIG. 1.

FIG. 3 is a schematic showing the effective equivalent capacitance in accordance with this invention.

FIG. 4 is a set of performance characteristic curves of the amplifier with and without the inventive circuit.

DETAILED DESCRIPTION

Referring to FIGS. 1 through 4, an amplifier circuit is shown with the inventive compensation network comprising $C$, $R_1$ and $R_2$ that enables achieving an effective equivalent capacitance $C'$ in the low picofarad range where such small capacitors are physically non-existant, for the purpose of flattening out and eliminating objectional peaks in the output voltage versus frequency characteristic curve as graphically depicted by FIG. 4.

Normally, the amplifier circuit to be compensated is powered by a current source 10 which is a function of an argument $\omega t$ to provide a current input $I$ into amplifier 12.

Amplifier 12 is shown in terms of its high open loop gain A, here a current gain, wherein the amplifier is of the conventional type with substantially 180° phase shift between its input and output terminals.

To appreciate the basis for enabling the achievement of an effective low picofarad capacitance, needed to obtain the compensation shown in FIG. 4, a development of the theory will be shown mathematically utilizing the voltage equivalent Thevenin circuit of FIG. 2 for the actual current equivalent circuit of FIG. 1 and then utilizing further equivalent circuit as in FIG. 3, adopting the effective capacitance $C'$ for the actual values of $C$, $R_1$ and $R_2$ as in FIG. 1.

It can be seen from voltage divider circuit phenomena, that:

$$V_1 = V_o \frac{R_2}{R_1 + R_2} \quad (1)$$

The conditions discussed herein will be true so long as $$X_c \geq 10 \frac{R_1 R_2}{R_1 + R_2} \quad (2)$$

wherein $X_c$ is the reactance of capacitor $C$ at any usable frequency $\omega$ in radians per second as in the D range of FIG. 4.

Using the Thevenin voltage equivalent which will represent a voltage source $V_2$ in series with a voltage source described in terms of $V_1$, as in equation (1), $$V_2 = IX_c = I\left[\frac{1}{j\omega c}\right] \quad (3)$$

$V_o$ then may be stated as:

$$V_o = -\left[I\frac{1}{j\omega c} + V_1\right]j\omega CR_f$$

$$= -IR_f - \frac{j\omega CV_o R_2 R_f}{R_1 + R_2} \quad (4)$$

Collecting terms and solving for $V_o$, we obtain, $$V_o\left[1 + \frac{j\omega CR_2 R_f}{R_1 + R_2}\right] = -IR_f \quad (5)$$

$$V_o = \frac{-IR_f}{1 + \frac{j\omega CR_2 R_f}{R_1 + R_2}} \quad (6)$$

At the $-3$db level, the real term of the denominator of (6) is equal to the imaginary term thereof. Therefore, $$\frac{\omega CR_2 R_f}{R_1 + R_2} = 1 \quad (7)$$

$$\omega = \frac{R_1 + R_2}{CR_2 R_f} \quad (8)$$

From the equivalent circuit of FIG. 3, and applying expression (2)

$$C' = \frac{CR_2}{R_1 + R_2} \quad (9)$$

Also from FIG. 3, it is obvious that the $-3$db voltage level solved in terms of frequency $\omega$ is:

$$\omega = \frac{1}{R_f C'} \quad (10)$$

Equating (8) and (10), we obtain:

$$\frac{R_1 + R_2}{CR_2 R_f} = \frac{1}{R_f C'} \quad (11)$$

which when solved for $C'$, becomes:

$$C = \frac{CR_2}{R_1 + R_2} \quad (12)$$

Thus we can see by using two approaches, the results for the effective equivalent capacitance C' is the same, as shown by (9) or (12).

Hence in order to compensate for peaking effect in amplifier 12 as shown by curve portion E which rises to an undesirable high level from the normal flat portion D, the proper effective capacitance C' is selected by using the C—$R_1$-$R_2$ network of FIG. 1 to obtain the low picofarad capacitance C' as shown by equations (9) or (12). This results in a desired drop off in voltage level as shown by curve portion F in FIG. 4.

For example, if a 0.01pF capacitance were required, $R_1$ might be selected as $10^6$ ohms, $R_2$ at $10^3$ ohms, and C at $10^{-11}$ farads, all achievable realistic capacitor-resistor values, in which case applying equations (9) or (12) would result in the required 0.01pF.

It is further pointed out that network C—$R_1$-$R_2$ has been reduced to actual practice in circuit such as FIG. 1, which values were determined in accordance with equations (9) or 12).

I claim:

1. A compensation network for reducing peaks in the output level versus frequency performance characteristics of an amplifier, comprising the combination:
   a first resistor one end of which is connected to the output of the amplifier;
   a second resistor one end of which is joined to the other end of the first resistor and the other end of said second resistor is at ground potential; and
   capacitively reactive means, connected between the input of the amplifier and the joined ends of the first and second resistors, for providing a reactance of at least ten times the ohmic value of the first and second resistors in parallel.

2. The invention as stated in claim 1, including a third resistor connected between the input and output of the amplifier.

* * * * *